United States Patent [19]

Stevens

[11] 4,028,616
[45] June 7, 1977

[54] BATTERY ANALYZER

[76] Inventor: Carlile R. Stevens, 468 El Rio Road, Danville, Calif. 94526

[22] Filed: Mar. 10, 1976

[21] Appl. No.: 665,519

[52] U.S. Cl. .............................. 324/29.5; 324/122
[51] Int. Cl.² ....................................... G01N 27/42
[58] Field of Search ............. 320/48; 324/29, 29.5, 324/122, 133; 340/249, 324, 336, 378

[56] References Cited

UNITED STATES PATENTS

| | | | |
|---|---|---|---|
| 3,356,936 | 12/1967 | Smith | 324/29.5 |
| 3,778,702 | 12/1973 | Finger | 324/29.5 |
| 3,781,658 | 12/1973 | Godshalk | 324/29.5 |
| 3,796,951 | 3/1974 | Joseph | 324/122 |
| 3,940,679 | 2/1976 | Brandwein | 324/29.5 |

OTHER PUBLICATIONS

Fritz, Indicating Lamp System for Diagnostic Measurement, IBM Tech. Disc. Bull., vol. 16, No. 9, Feb. 1964, pp. 2841, 2842.

Primary Examiner—Rudolph V. Rolinec
Assistant Examiner—Michael J. Tokar
Attorney, Agent, or Firm—Roger A. Marrs

[57] ABSTRACT

An analyzer is disclosed herein for testing an automobile battery by comparing the battery voltage to a precise reference established by a resistive divider and operational amplifiers. In this unit, digital integrated circuits are employed including eight operational amplifiers and a stable reference voltage source which combine with light emitting diodes to allow the exact condition of any battery to be readily determined.

8 Claims, 3 Drawing Figures

BATTERY ANALYZER

BACKGROUND OF THE INVENTION

1. Field of the Invention

This invention relates to battery analyzers and more particularly to a novel battery analyzer which is a precision instrument having circuitry for conveniently and accurately testing automobile batteries through automatic operation of the analyzer and distinct visual indication of the test results.

2. Description of the Prior Art

In the past, a variety of devices such as volt meters and the like have been used to test the storage capacity and the potential operating condition of conventional wet cell storage batteries such as automobile batteries. However, conventional battery testers do not provide for adequate visual indication of the battery condition under test and the testers are not only very expensive but greatly restricted in their ability to perform a variety of tests. Furthermore, accuracy of voltage measurement of a particular battery is seriously questioned when using conventional devices since the testing of the battery is accomplished without a normal load being placed on the battery. Also, difficulties have been encountered when using conventional battery testers which stem largely from the fact that testing of the battery is not automatic and even though a given tester may be employed for performing several tests, many different adjustments to the device and to the battery are necessary in order to achieve the desired results. In the true sense of the word, conventional battery testing devices merely "test" the battery and do not analyze the condition of the battery.

Therefore, a long standing need is present to provide a battery analyzing device which is automatic in its operation and which performs quick and accurate tests on the battery so as to completely analyze its capabilities and voltage condition.

SUMMARY OF THE INVENTION

Accordingly, the above difficulties and problems are obviated by the present invention which provides, in general, a battery analyzer that determines the battery voltage by comparing it to a precise reference established by a resistive divider and operational amplifiers. Once the battery voltage has been determined by the comparison, the reading is latched or retained for visual observation and further changes in battery operation have no effect even after a time interval. The device of the present invention includes means for connecting the analyzer directly across the terminals of the battery while installed in a vehicle and means are provided for analyzing the percentage of charge in the battery and the adequacy of the battery for the particular vehicle in which it is installed. Means are provided for determining voltage while the battery is under load and at least two different measuring scales are employed for reading the condition of the battery. A charge test using a plurality of light emitting diodes is employed for indicating the actual charge level. The battery voltage is read on a selected one of two scales. The voltage scale is expanded through the critical range to provide more accuracy than possible with a standard meter. A touch sensor is operably connected to the circuit for connecting the unit to the battery terminals and by momentarily touching the sensor, readings take place which are, for example, directly related to the specific gravity of the electrolyte. Additional means are incorporated in the circuitry for measuring the battery capacity by using the starting motor of the vehicle as a fully operative load under actual operating conditions.

Therefore, it is among the primary objects of the present invention to provide a novel battery analyzer which analyzes battery capacity and which visually indicates actual battery voltage (actual charge level).

Another object of the present invention is to provide a novel battery analyzer having a plurality of light emitting diodes operably connected via an electronic circuit to a touch sensor whereby actuation of the sensor effectively connects the battery to a selected one of a plurality of circuits for visually indicating battery capacity and battery voltage level.

Still another object of the present invention is to provide a novel battery analyzer which is a precision electronic instrument for providing accurate voltage level of a battery under actual load conditions.

Another object of the present invention is to provide a novel battery analyzer taking into account electrolyte temperature and battery capacity under actual load condition.

BRIEF DESCRIPTION OF THE DRAWINGS

A detailed description of the invention will be made with reference to the accompanying drawings wherein like numerals designate corresponding parts in the several figures.

DESCRIPTION OF THE PREFERRED EMBODIMENT

The following detailed description is of the best presently contemplated mode of carrying out the invention. This description is not to be taken in a limiting sense, but is made merely for the purpose of illustrating the general principles of the invention since the scope of the invention best is defined by the appended claims.

Figure 1:
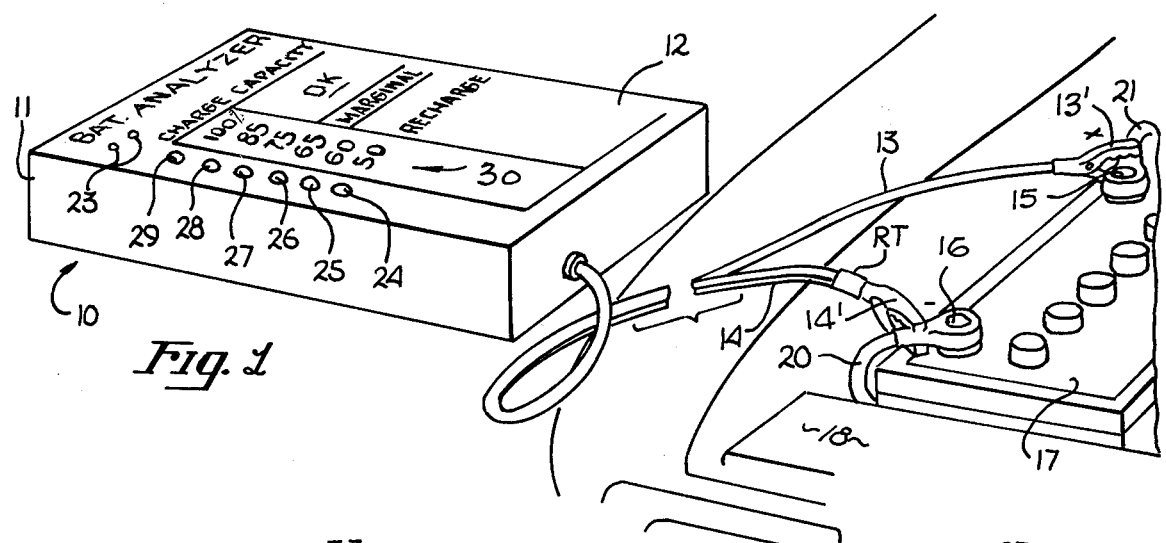
FIG. 1 is a perspective drawing of the battery analyzer shown coupled to a typical storage battery in a vehicle.

Referring to FIG. 1, the inventive battery analyzer 10 is contained in a housing 11 having a front panel 12 containing information pertaining to the measured battery condition. The analyzer 10 has a pair of test cables 13, 14 that are connected via alligator clips 13', 14' to the respective positive (+) and negative (−) terminals 15, 16 of the conventional wet cell battery 17 under test. Typically the battery 17 is installed in an automobile 18, and during the test remains connected to the other vehicle electrical system components via the battery cables 20 and 21.

The analyzer 10 separately tests the condition of the battery 17 under no-load and full-load conditions. Prior to the test, the vehicle 18 high beam headlights advantageously are turned on for one minute, to drain off the surface charge from the battery 17. The headlights then are turned off, and the no-load battery test is initiated by touching the sensor contacts ("touch buttons") 23 on the analyzer front panel 12. After a brief time interval, one or more of a set of light emitting diodes 24 – 29 on the panel 12 will light up. The indicia 30 of highest value next to an illuminated LED 24 – 29 will indicate the percentage charge on the battery 17. For example, if all the LED's 24 - 28 are lit, the battery charge is eighty-five percent. As described below, this charge value is directly related to the voltage output of the battery 17 (corrected for electrolyte temperature) and of the electrolyte specific gravity.

To test the battery 17 under a fully loaded condition, the high voltage output lead from the center of the vehicle 18 distributor (not shown) is disconnected, and the vehicle engine is cranked for ten seconds and then stopped. During this cranking, the output voltage of the battery 17 will drop significantly. The reduced output voltage level is sensed by the battery analyzer 11 and automatically causes the voltage measurement components therein to switch range. After a brief timing interval, the voltage output from the battery 17 will cause one or more of the light emitting diodes 24 - 29 to go on. This will indicate the battery condition under load. The voltage measurement is taken after the starter motor has run for a few seconds, so that the battery 17 output is measured after the initial high surge of current required to begin cranking.

For a nominal 12 volt wet cell battery 17, the output voltage under no-load conditions will vary as a function of the electrolyte specific gravity, corrected for temperature. The relationship between the voltage, specific gravity and percentage charge is set forth in Table I below.

provides, via a potentiometer 34, a fixed reference voltage of, typically, 6.25 volts.

Accurate measurement of the battery 17 output voltage is achieved by comparison to a set of reference voltages provided by a reference amplifier 35 and a resistor divider (R/D) 36. The voltage comparison is carried out by a set of operational amplifiers 37 - 42 each of which receives (a) a respective reference voltage from the divider 36 and (b) a signal indicative of the battery 17 voltage derived by an input network 44 and supplied via a line 45. The outputs of the comparators 37 - 42 actuate an output latch 46 that turns on those LED's 24 - 29 corresponding to the measured voltage.

As is evident from Table I, the battery analyzer 10 must be capable of resolving very small voltage differences. For example, a voltage difference of only 0.06 volts separates the voltage levels (12.42 volts and 12.48 volts) that indicate respective charge levels of 65% and 75%. Moreover, voltage changes in mid-range are the most critical. To insure accurate voltage measurement, particularly in mid-range, the battery analyzer 10 employs a reference voltage feedback circuit which insures that the reference voltage at the center of the resistor divider 36 is correct. To this end, a feedback resistor R1 is connected from the center of the divider 36 to the inverting (−) input 35a of the amplifier 35. This terminal also is connected to ground via a pair of

TABLE 1

| LAMP (LED) | PERCENTAGE CHARGE | VOLTAGE | SPECIFIC GRAVITY | INSTRUCTIONS |
|---|---|---|---|---|
| 29 | 100% | 12.65 | 1.261 | CHARGE O.K. PROCEED TO LOAD TEST |
| 28 | 85% | 12.56 | 1.247 | CHARGE O.K. PROCEED TO LOAD TEST |
| 27 | 75% | 12.48 | 1.233 | If air temperature is above 60° check voltage reg. setting before LOAD TEST. PROCEED TO LOAD TEST |
| 26 | 65% | 12.42 | 1.223 | Charge battery BEFORE LOAD TEST. Failure to accept full charge indicates defective battery. DO NOT LOAD TEST. |
| 25 | 60% | 12.37 | 1.213 | If voltage regulator setting is proper, battery is deficient. |
| 24 | 50% | 12.30 | 1.202 | |

Figure 2:
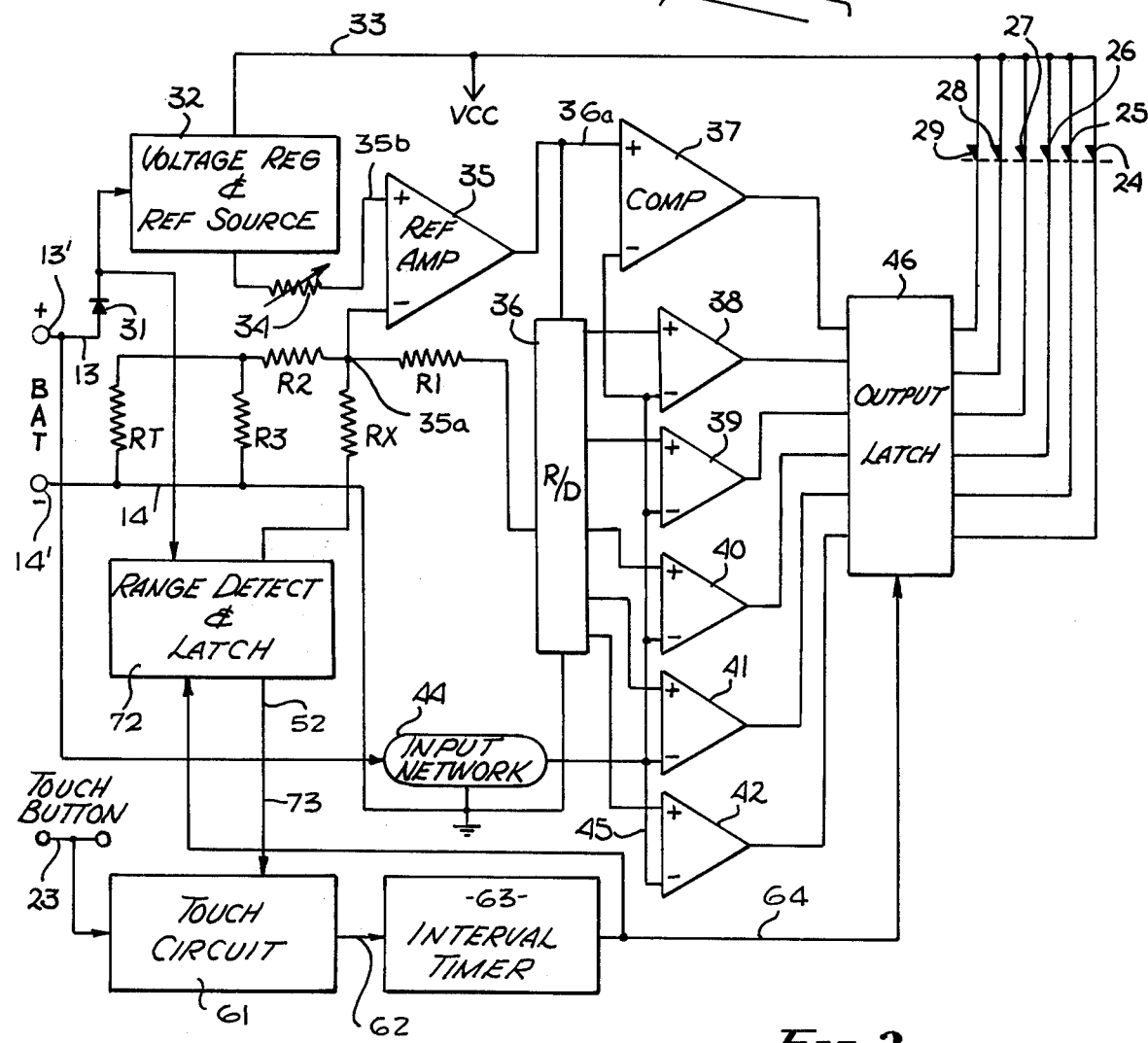
FIG. 2 is a block diagram of the electrical circuit employed in the battery analyzer shown in FIG. 1.
Figure 3:
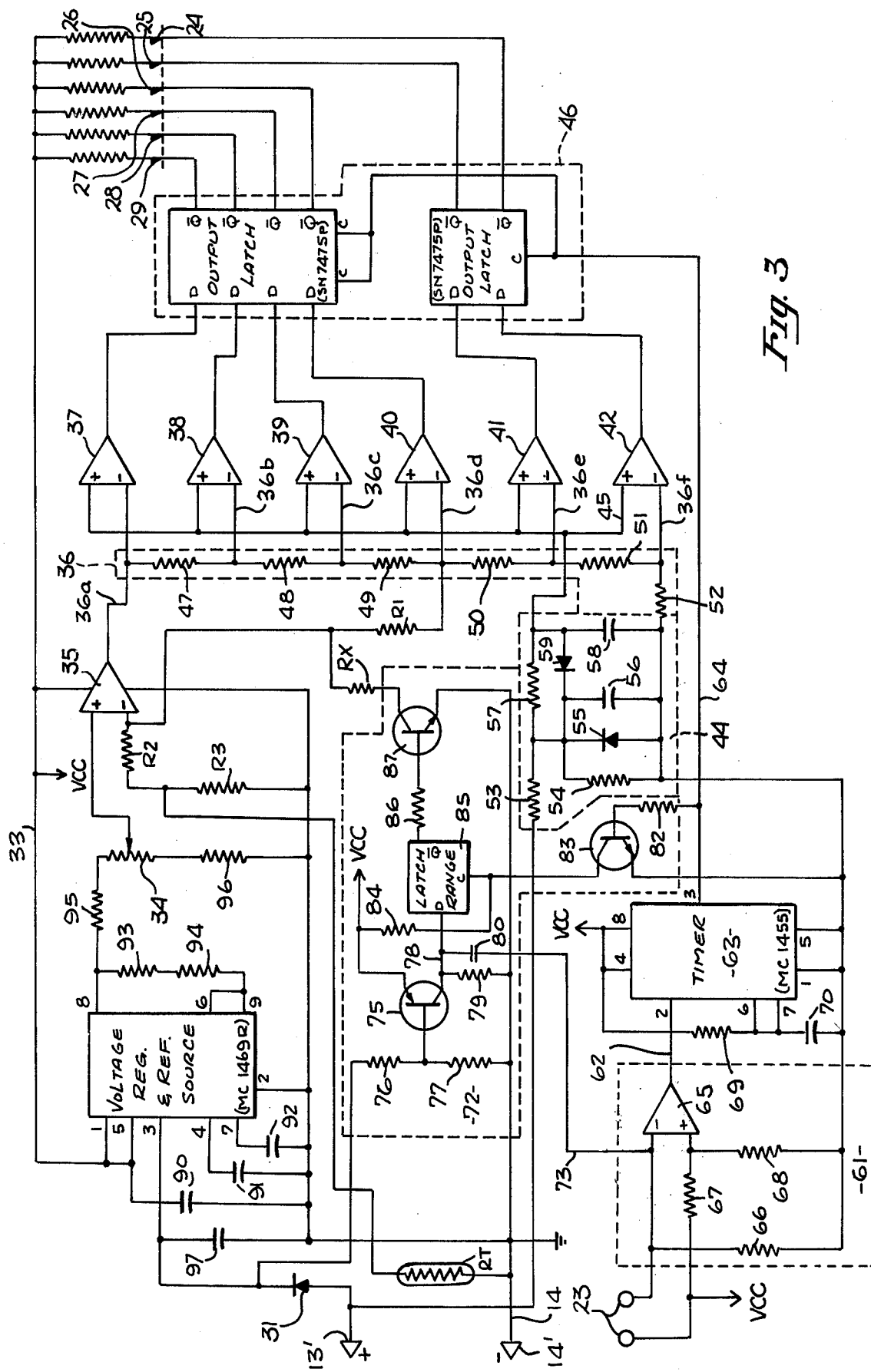
FIG. 3 is a circuit diagram of the battery analyzer covered by the block diagram of FIG. 2.

The circuitry of FIGS. 2 and 3 is designed to measure the output voltage of the battery 17 under unloaded conditions in the narrow voltage range (typically 12.30 volts to 12.65 volts) over which the voltage varies as a function of the specific gravity of the battery electrolyte. The circuitry automatically compensates for the electrolyte temperature, which is sensed by the thermistor or temperature sensitive resistor RT that is physically mounted on the alligator clip 14' (FIG. 1). Since the battery terminal 16 is in direct thermal contact with the electrolyte, the temperature of that terminal, as sensed by the thermistor RT, accurately indicates the electrolyte temperature.

Referring to FIG. 2, the positive polarity battery cable 13 is connected via a diode 31 to a voltage regulator and reference source 32 that provides a voltage VCC via a line 33 to the various circuits in the analyzer 10. The diode 31 protects the circuitry should the cables 13, 14 inadvertently be connected to the wrong polarity terminals of the battery 17. The circuit 32 also resistors R2 and R3. The fixed reference voltage from the potentiometer 34 is applied to the non-inverting (+) input 35b of the amplifier 35. With this arrangement, if the voltage at the center of the divider 36 should vary, feedback via the resistor R1 and the amplifier 35 will cause an appropriate correction in the output voltage supplied to the divider 36 via the line 36a so as to bring the center of the divider 36 back to the correct voltage. Since the feedback reference point is the center of the divider 36, tolerance errors in the resistors forming the divider 36 are separated on each side of center, and are not additive. As a result, optimum accuracy in voltage measurement is achieved at the center of the voltage range.

Temperature compensation is introduced by the thermistor RT which is connected in parallel with the resistor R3. With this arrangement, the gain of the amplifier 35 is modified by changes in the resistance of the thermistor RT, the amount of correction being fixed by the resistor R3. The feedback loop gain is established by the resistors R1 and R2 so that proper change in reference voltage is introduced to compensate for changes in the battery electrolyte temperature, as measured by the resistor RT.

As shown in FIG. 3, the resistor divider 36 includes a set of resistors 47 – 52 connected between the output terminal of the reference amplifier 35 and ground. The highest reference voltage 36a is supplied to the inverting (−) input of the comparator 37, and reference voltages of progressively decreasing value are supplied to the inverting (−) inputs of the comparators 38 – 42 via the respective lines 36b through 36f from the junctions of the respective resistors 47 – 52 in the divider 36. The center 36d of the divider 36 also is connected to the feedback resistor R1 as described above.

The voltage from the battery 17 is supplied to the non-inverting (+) inputs of all of the comparators 37 – 42 via the input network 44. As shown in FIG. 3, this network includes a resistor divider including the resistors 53 and 54 connected between the battery leads 13 and 14. A diode 55 connected across the resistor 54 provides polarity protection. That is, it prevents the battery voltage from being applied to the comparator input line 45 in the instance that the battery clips 13′, 14′ are placed on the wrong terminals of the battery 17. A capacitor 56 cooperates with the resistor 53 to integrate the input voltage, which is supplied to a second RC integrator consisting of a resistor 57 and a capacitor 58. Advantageously, this dual integrator input network 44 has an integration period of four seconds. A diode 59 modifies the integration characteristics so as to obtain correct voltage measurement under conditions of large low-voltage fluctuation as is present during slow cranking or when the battery is marginal.

To initiate measurement of the unloaded battery voltage, the user touches the buttons 23. This causes a touch circuit 61 (FIG. 2) to provide a signal on a line 62 that actuates a timer 63. At the end of an interval of about eight seconds, the timer 63 provides a signal on a line 64 which enables the output latch 46.

The latch 46 consists of six flip-flops, each associated with a respective one of the comparators 37 – 42. A certain subset of these comparators 37 – 42 will have high output signals, indicating that the battery voltage 17 (as scaled by the input network 44) exceeds the corresponding reference voltage levels supplied to that subset of comparators. When the output latch 46 is enabled, the corresponding subset of flip-flops will be latched, turning on the corresponding subset of the light emitting diodes 24 – 29. For example, if the battery 17 output voltage is 12.46 volts, the comparators 40, 41 and 42 will have high outputs, and the LED's 24 – 26 will go on. The percentage charge (65%) and electrolyte specific gravity (1.223) then can be obtained directly from the information on the plate 12 or by reference to a listing such as that of Table I.

Referring to FIG. 3, the touch circuit 61 comprises an operational amplifier 65 and a set of input resistors 66 – 68. The output of the amplifier 65 normally is high. The low resistance and static charge resulting from finger touch on the buttons 23 causes the amplifier 65 output on the line 62 to go low. This actuates the timer 63, which advantageously comprises a Motorola MC 1455 integrated circuit. The timing interval is established by a resistor 69 and a capacitor 70 associated with the circuit 63.

To test the battery 17 under full load, the starter of the automobile 18 is cranked. As mentioned above, this causes the battery 17 voltage to drop. The reduced voltage is sensed by a range detect and latch circuit 72 (FIG. 2) which performs two functions. First, it changes the voltage range measured by the analyzer 10. This is accomplished by shunting a resistor RX between the input terminal 35a of the reference amplifier 35 and ground. Secondly, the circuit 72 provides a signal on a line 73 that actuates the timer 63. As a result, after the interval established by the timer 63, the LED's 24 – 29 will indicate the output voltage of the loaded battery 17. This measurement is initiated automatically without need to touch the buttons 23. Thus the measurement will be made automatically while the operator is inside the vehicle 18 cranking the engine. The latch 46 will "hold" the measurement, so that when the operator gets out of the vehicle 18 and walks back to the analyzer 10, the LED's 24 – 29 will continue to indicate the battery voltage under load conditions, even though the cranking now has ended. Since the output latch is set at the end of the interval established by the timer 63, the actual voltage measurement is taken after the initial surge of current is provided by the battery 17 to first turn over the starter motor. That is, the measurement is taken after the starter has begun operation and the load on the battery 17 has stabilized.

The relationship between the output voltage from the battery 17 under full load and the condition of the battery is indicated by the following Table II.

TABLE II

| LAMP (LED) | VOLTAGE | LOAD TEST INDICATION | INSTRUCTIONS |
|---|---|---|---|
| 29 | 9.75 | Battery is providing full voltage for starting. | Battery O.K.-condition of cables may be checked by performing CHARGE TEST at starter terminals. Should indicate not less than 75%. |
| 28 | 9.68 | Battery is O.K. if air temp. is above 70° check amp. rating for displacement. | |
| 27 | 9.62 | Battery is marginal if CHARGE TEST indicated above 60% | Battery is NOT capable of additional cranking. Recharge if cables are to be tested. |
| 26 | 9.57 | If air temperature is above 60° the battery is questionable. Test all connections. | DO NOT TEST further until battery is recharged. |
| 25 | 9.53 | Battery is defective. | Check all cables. Check voltage regulator setting. Replace battery |
| 24 | 9.45 | Battery is defective. | |

Referring to FIG. 3, the range detect and latch circuit 72 includes a transistor 75 the base of which is connected to the junction of a divider consisting of the resistors 76 and 77 connected across the input from the battery 17. The values of these resistors 76, 77 are selected so that when the battery voltage is greater than about 11 volts, the transistor 75 will be biased off, so that a low signal appears on the line 78 across the collector resistor 79. However, when the battery 17 is loaded so that the voltage drops substantially below 11 volts, the transistor 75 goes on and a high signal is present on the line 78. This is provided via a capacitor 80 and the line 73 to the input of the amplifier 65. As a result, the signal on the line 62 goes low to initiate operation of the timer 63. That is, the timer 63 automatically is actuated when the battery 17 voltage drops below 11 volts.

At the end of the timer 63 interval, the signal on the line 64 is provided via a resistor 82 to the base of the transistor 83. As a result, the transistor 83 goes on, causing current to be drawn through a resistor 84 and applying a low signal to the C input of a flip-flop 85 that functions as a "range latch". Since a high signal is present on the line 78 at the D input to the latch 85, a high output is provided from the $\overline{Q}$ output. This signal, supplied via a resistor 86, turns on a transistor 87 thereby connecting the resistor RX into the amplifier 35 input circuit. As a result, the reference voltages supplied by the resistor divider 36 are reduced so that a voltage measurement takes place in the low range commensurate with the loaded battery 17 output. Note that the transistor 83 also is turned on by the timer 63 output during measurement of the battery 17 under unloaded conditions. At that time, however, since the battery voltage is greater than eleven volts, the signal on the line 78 is low so that a low $\overline{Q}$ output is obtained. As a result, the transistor 87 is not turned on and the resistor RX is not inserted in this circuit. As a result, measurement takes place at the higher voltage range.

The voltage regulator and reference source 32 advantageously is implemented using a Motorola type MC 1469R integrated circuit connected as shown in FIG. 3, in conjunction with the capacitors 90 – 92 and the resistors 93 and 94. The fixed reference voltage is obtained from terminal 8 of this integrated circuit and is supplied to the amplifier 35 via a voltage divider including the potentiometer 34 and a pair of fixed resistors 95 and 96. A capacitor 97 is used to filter the input battery voltage. The output latch 46 advantageously is implemented using a pair of National Semiconductor type SN 7475P integrated circuits, each of which contain four flip-flops. Since two such integrated circuits provide eight flip-flops, six are used for the latch 46, one may be used for the range latch 45, and one is unused.

Intending to claim all novel, useful and unobvious features shown or described, the inventor makes the following claims:

1. A battery analyzer for analyzing a wet cell battery that is connected to a vehicle engine, including voltmeter means for measuring the voltage from said battery within a narrow range over which the unloaded battery output will vary as a function of specific gravity of the electrolyte of said battery, said voltmeter means comprising;
   a resistor voltage divider;
   a circuit for providing an input reference voltage across said divider;
   a plurality of voltage comparators each receiving as a first input a respective reference voltage obtained from a tap on said divider, said respective reference voltages being of incrementally greater value with respect to each other;
   input network means for applying to the other input of each voltage comparator a voltage derived from the output of the battery under test;
   a like plurality of indicator lamps;
   an output latch connected between the outputs of said comparators and said lamps, said latch, when enabled, causing certain of said lamps to light up to indicate those comparators at which the voltage derived from said battery exceeds the respective reference voltage, said lamps thereby indicating the unloaded battery voltage and hence the electrolyte specific of the battery under test;
   said circuit for providing a reference voltage comprises;
   an operational amplifier having a fixed reference voltage applied to the non-inverting input, the output of said amplifier being connected across said divider as said input reference voltage;
   a feedback resistor connected between a tap of said divider and the inverting input of said operational amplifier to provide negative feedback that stabilizes the voltage at said tap;
   a thermistor, mounted to sense the temperature of the electrolyte of said battery under test, and connected to the inverting input of said operational amplifier to correct said input reference voltage, and hence the voltage mesurement, for changes in electrolyte temperature;
   a range detect and latch circuit for changing the range of said voltmeter means when the battery voltage drops under load, said range detect and latch circuit comprising;
   a flip-flop;
   means for setting said flip-flop to a first state when the voltage of the unloaded battery is measured, and for setting said flip-flop to a second state in response to reduced voltage from said battery when under load; and
   a range-change resistor and means for connecting said range-change resistor to the inverting input of said operational amplifier when said flip-flop is set to said second state, said range-change resistor thereby reducing the input reference voltage applied across said divider so that a lower voltage range is measured, said lower range corresponding to that range over which said battery will vary, when loaded, depending on the battery operational condition.

2. A battery analyzer according to claim 1 wherein said connecting means includes a pair of battery cables having clips for attachment to the terminals of said battery under test, and wherein said temperature sensor comprises a thermistor mounted to one of said clips.

3. A battery analyzer according to claim 1 further comprising an interval timer for delaying voltage measurement by said voltmeter means for an interval of time after said measurement is initiated, said time interval being sufficient to permit said battery current to stabilize after initial loading of said battery by a starting motor.

4. A battery analyzer according to claim 1 together with touch responsive switch means for initiating measurement by said voltmeter means of the voltage from said unloaded battery under test.

5. A battery analyzer according to claim 1 wherein said battery analyzer includes a pair of cables for electrical connection to said battery under test, said cables each having a clip for attachment to a respective terminal of said battery, said thermistor being mounted in one of said clips.

6. A battery analyzer according to claim 1 further comprising;
   switch means for initiating a voltage measurement,
   a timer, actuated by said switch means and providing an enable signal to said output latch after a fixed time interval, so that said output latch is enabled and said voltage indicating lamps are activated at the end of said fixed time interval to indicate the unloaded battery voltage.

7. A battery analyzer according to claim 6 further comprising an interconnection between said range detect and latch means so that when said battery voltage under load is detected, said timer also is actuated, the resultant enable signal again enabling said output latch and causing said lamps to indicate the loaded battery voltage at the end of said fixed time interval, said interval being sufficiently long to permit the current drawn from said battery by the vehicle starter motor to stabilize before said loaded voltage measurement is made.

8. A battery analyzer according to claim 1 wherein said input network means includes an integrator for time-integrating the voltage from said battery.

* * * * *